TWO TERMINAL SEMICONDUCTOR HIGH FREQUENCY OSCILLATOR

Filed Feb. 16, 1965 3 Sheets-Sheet 1

INVENTORS B. C. DE LOACH, JR.
R. L. JOHNSTON
BY H. W. Lockhart
ATTORNEY

United States Patent Office 3,270,293

Patented August 30, 1966

3,270,293
TWO TERMINAL SEMICONDUCTOR HIGH FREQUENCY OSCILLATOR

Bernard C. De Loach, Jr., Murray Hill, and Ralph L. Johnston, South Plainfield, N.J., assignors to Bell Telephone Laboratories, Incorporated, New York, N.Y., a corporation of New York Filed Feb. 16, 1965, Ser. No. 433,088
10 Claims. (Cl. 331—107)

This invention relates to high frequency energy generating devices and, more particularly, to those depending on transit time effects in a solid state element.

Patent No. 2,899,652 to W. T. Read, and Patent No. 2,794,917 to W. Shockley referred to therein, disclose semiconductor negative resistance devices which utilize transit time effects.

In general, negative dynamic resistance can be developed in two terminal semiconductive elements by correlating the structural and operating parameters of the elements so that the period of the operating frequency and the transit time of charge carriers across a particular region are properly related. The negative power dissipation in these devices is the result of a shift in phase between an applied A.C. voltage, which may arise internally, for example, as a result of noise, and the A.C. current flowing through that portion of the device across which the principal voltage drops occurs.

An object of this invention is a transit time diode for mounting in a resonant cavity to produce high frequency power, which may be fabricated facilely.

In particular, an object is a transit time semiconductor diode structure which does not require the quite critically dimensioned, very low conductivity zones required in such devices heretofore.

Another object is a transit time diode for incorporation in a resonant cavity to produce high frequency energy in which the mode of operation is less critical than such devices heretofore.

In accordance with one aspect of this invention, a silicon semiconductor diode is mounted in a suitable resonant cavity, for example, a waveguide portion and arranged for the application thereto of a steady bias voltage. In particular, the diode is of the P+NN+ configuration, in which the P+ and N zones are fabricated in very thin layers and advantageously, for very high frequencies, within an epitaxially grown region.

A D.C. voltage to reverse bias the junction to beyond avalanche breakdown is applied to the diode. In this condition a current flows within the device which gives rise to a negative dynamic resistance and, with appropriate circuitry to continuous wave oscillations at frequencies related to the width of the space charge region induced principally within the N zone.

One advantage of this device, in contrast to prior art transit time devices, is the use of zones of moderate conductivity instead of the intrinsic and near-intrinsic conductivity zones which characterize those previous structures. In particular, this simplifies the fabrication process.

In general, the minimum conductivity used for the intermediate region is determined by the state of the art limitations on junction and surface technology. The aforementioned Read patent teaches that for minimum loss the intermediate region should be intrinsic. In accordance with this invention it is recognized that it is advantageous to depart from the use of intrinsic material for this region to material of moderate conductivity, thereby enabling a moderate D.C. current to flow, for at least two reasons. First, we have found that the existence of a moderate D.C. current tends to minimize the effects of microplasmas. Second, we have found that this current also minimizes surface effects in that a small number of charges do not vary the internal fields, on a percentage basis, to the previous extent.

The invention will be more clearly understood from the following detailed description of the drawing in which.

Figure 1:
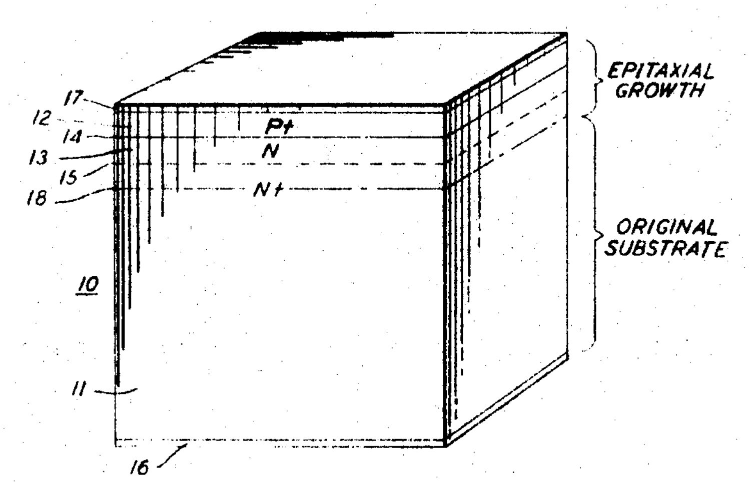
FIG. 1 is a perspective view illustrating the semiconductor diode structure in accordance with this invention.

FIG. 1 shows a silicon die including the several conductivity-type zones in accordance with one embodiment of this invention. It will be understood that the drawing is exaggerated in certain dimensions to facilitate description. The substrate terminal zone 11 is of N+ material, characterized as degenerate and having an impurity concentration of about $10^{20}$ atoms for cc. In functional terms, degenerate material is material which has a sufficiently heavy impurity concentration such that the resistance contribution of the material is small. The opposite terminal zone 12 is of degenerate P+ material having a similarly high impurity concentration in excess of about $10^{20}$ atoms per cc. Intermediate the terminal zones is an N-type zone 13 of moderate conductivity having an impurity level of about $10^{16}$ atoms per cc.; a typical value being about $3 \times 10^{16}$ atoms per cc.

The die 10 typically is produced by first processing a slice of silicon material and cutting this slice into the individual dies as represented by the element 10. Although the following description will be given in terms of the treatment steps as applied to the element 10 shown in FIG. 1, it will be understood that they are carried out on a large slice of about one-half to three-quarters of an inch in diameter.

The initial material is a uniformly doped substrate approximately three mils (75 microns) in thickness. This is N+ material having the high impurity concentration suggested above. On the face of this material a thinner layer, approximately 25 microns in thickness of N-type conductivity material, is grown by epitaxial deposition. This technique is well known in the art and is disclosed, for example, in United States Patent 3,165,811, issued January 19, 1965, to J. J. Kleimack, H. H. Loar and H. C. Theuerer. By suitable control of the process the impurity concentration is kept substantially constant through this epitaxially grown layer and is typically about $3 \times 10^{16}$ atoms per cc.

The semiconductor element next is subjected to a diffusion heat treatment using a boron-containing compound which converts the upper face of the epitaxially grown layer to P+ conductivity-type to a depth of approximately eight to nine microns. As previously noted the impurity concentration in this zone is made about $10^{20}$ atoms per cc. The boundary of this diffused P+ terminal region 12 constitutes the P-N junction 14 of the device.

During this diffusion treatment donor impurity atoms also advance from the N+ substrate 11 across the original boundary 18 with the epitaxial layer. The extent of this penetration depends on the diffusion coefficient of the particular impurity. In this specific embodiment using an arsenic doped substrate the penetration is small.

Thus, the NN+ boundary 15 is displaced about one to two microns into the epitaxial layer leaving a uniformly doped N zone 13 which is about fifteen microns in thickness. Although the thickness of this intermediate region is not critical, except to the extent discussed below, excessive thickness beyond that required to accommodate the space charge region is a source of loss.

In particular, as is well understood, because of the relationship between operating frequency and carrier transit time, high frequency operation of solid state devices requires very thin conductivity-type zones. Within the limits of the present technology an intermediate zone 13 ranging from 25 microns down to 2500 A. may be provided and is suitable for devices operating in the range of about one to two gigacycles to possibly one hundred gigacycles, respectively. Extension of the technology should permit the achievement of higher frequency responses.

Ohmic contacts 16 and 17 of plated metal are applied to the terminal zones 11 and 12, respectively, by techniques known in the art, such as nickel plating followed by gold plating. As previously noted, the foregoing processing is done on a slice of material which is diced into 125 micron square elements having a total thickness of approximately 75 microns. The individual die 10 then is mounted in a conventional cartridge-type encapsulation as illustrated in FIG. 5.

Figure 5:
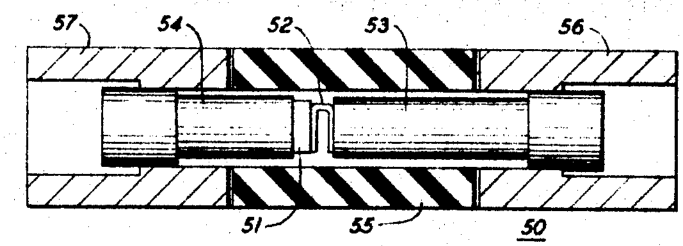
FIG. 5 is a cross-section view of an encapsulated diode suitable for use in this invention.

In the exemplary encapsulated device of FIG. 5 the semiconductor P-N junction diode 51 is mounted in electrical contact with a lead member 54 which in turn is held within the metal sleeve 57 which serves as one terminal of the device. Electrical contact is made to the opposite side of the diode by means of the metal C-spring member 52 mounted upon another lead 53 supported within the sleeve 56 comprising the opposite terminal of the device. Intermediate the sleeve members 56 and 57 and sealed thereto is a cylindrical insulating member 55, typically of ceramic.

Figure 4:
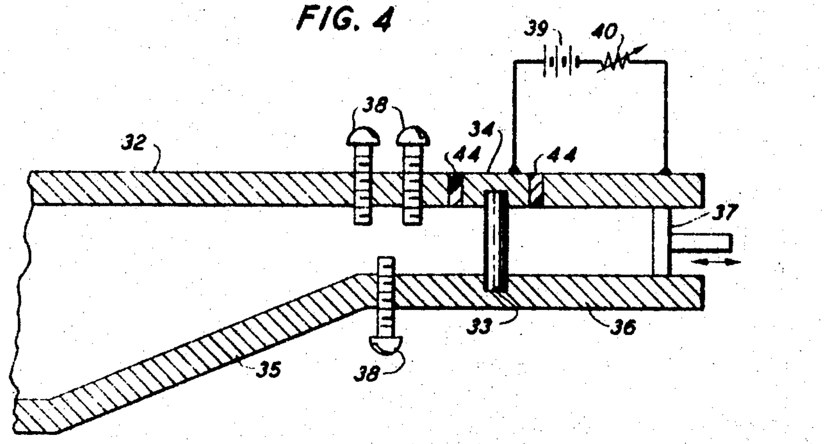
FIG. 4 is a schematic cross section of a waveguide portion including a diode and connected for operation particularly as an oscillator, in accordance with this invention.

The encapsulated diode 50 of FIG. 5 is mounted in a reduced height waveguide portion as shown in FIG. 4 to constitute an oscillator when the cavity is suitably tuned to resonance at an appropriate frequency related to the transit time characteristics of the diode as described more fully below. The encapsulated diode 33 is recessed in the walls of the guide so as to expose to the wave energy path only the semiconductor wafer and the connecting leads. Desirably the height of the waveguide portion 36 is selected so that the capacitance of the diode is series resonant with the inductance of the lead structure within the encapsulation at the operating frequency. In effect, by so adjusting the height, the device capacitance is tuned out.

One terminal of the diode 33 is mounted in a waveguide segment 34 which is insulated direct current-wise by a thin insulating layer 44, typically of Mylar. It is desirable that this insulation be thin to introduce as little radio frequency discontinuity as possible. The other terminal of the diode 33 is electrically connected to the waveguide proper. Accordingly, direct current bias voltage is applied by connecting between the waveguide segment 34 and the waveguide 36, a D.C. voltage source 39 and means for adjusting the voltage comprising the variable resistor 40.

Between the full height portion 32 and the reduced height portion 36 is a tapered section 35 constituting an impedance transforming portion. At the end of the reduced height portion is an adjustable piston 37 for tuning the cavity and a series of adjusting screws 38 for impedance matching.

In a specific embodiment the full height waveguide portion 32 was 900 mils wide and 400 mils high. The reduced height portion 36 was the same width but only 50 mils high and the transformation section was a three wavelength raised cosine taper. Using a P+NN+ diode of the configuration and dimensions described above and an applied D.C. bias of about 50 volts providing a current of about 50 milliamperes, with the cavity tuned to 8.9 gigacycles an output of 2.7 milliwatts was observed.

Figure 3:
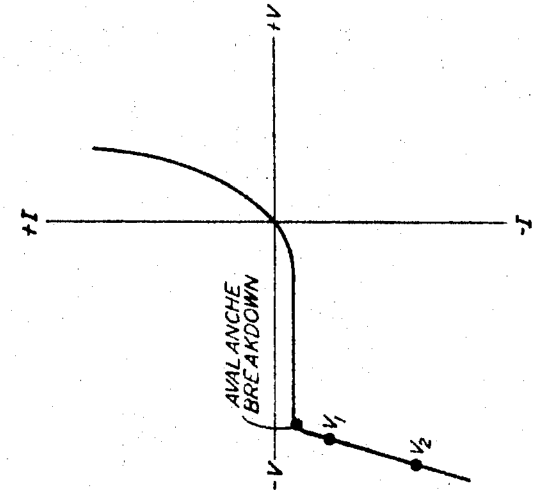
FIG. 3 is a graph of the current voltage characteristic of the diode illustrating the bias level used in accordance with this invention.

The operation of the device as described above appears to be consistent with the theory propounded by Read in his patent noted hereinabove, although there are the important distinctions in diode configuration and degree of direct current biasing. In particular, referring to the graph of FIG. 3 there is depicted the D.C. current-voltage characteristic curve of the P-N junction semiconductor diode. In the reverse direction the avalanche breakdown point is noted as the point where, with small increases in voltage in the reverse direction there is a large increase in the current flowing through the diode. The phenomena of avalanche breakdown is explained more fully in the article by K. G. McKay in the Physical Review, volume 94, pages 879 through 884, May 15, 1954, entitled, "Avalanche Breakdown in Silicon."

Figure 2:
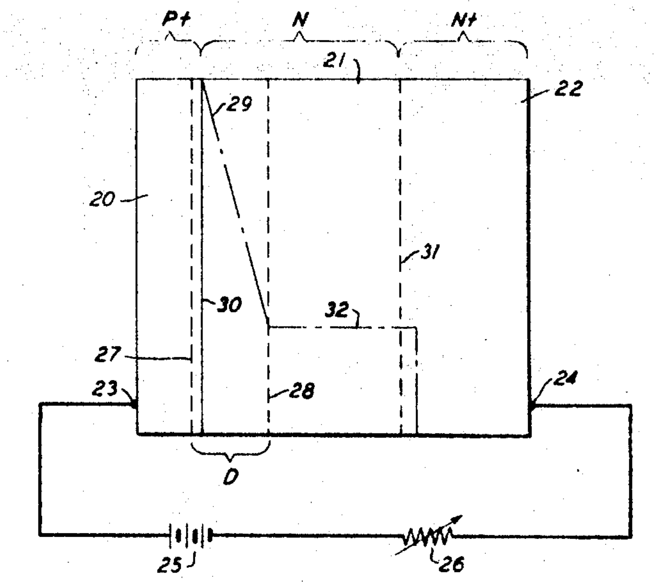
FIG. 2 is a graphical representation of the diode of FIG. 1 showing the relation of space charge and field distribution within the device.

FIG. 2 shows in diagrammatic form the depletion layer and field distribution within the semiconductor diode. The P+, N, and N+ zones are labelled 20, 21 and 22, respectively. The D.C. source 25 and variable resistor 26 are shown serially connected by way of ohmic contacts 23 and 24 to the terminal zones 20 and 22 of the diode. When the bias voltage is raised to the value represented by the point $V_1$ on the reverse portion of the curve of FIG. 3 the depletion layer or space charge region D extends from the P-N junction 30 principally into the N zone 21, which has the lower carrier concentration, to the boundary line 28. The other boundary line 27 depicts the very slight extension of the space charge region into the heavily-doped P+ zone 20.

The magnitude of the electric field plotted against distance across the zones of the diode is shown by the broken line 29. For graphic purposes the top line of the device outline is the field magnitude corresponding to avalanche breakdown, hence the line 29 depicts the field level for the bias voltage $V_1$ and the space charge region D depicted. Typically, for the conditions described hereinabove, namely a reverse bias of about 50 volts, the space charge width is about two microns.

As can be seen the field drops from the level corresponding to avalanche breakdown near the P-N junction to a lower value at the edge 28 of the swept out layer. Under these conditions a continuous current flows giving rise to a negative dynamic resistance and to a transit time effect. As a consequence, the device goes into oscillation at a basic frequency related to the width of the space charge region D. Specifically, it appears that for optimum operation the carrier transit time across D is substantially equal to $t/2$ where $t$ is the period of the oscillation frequency.

Figure 6:
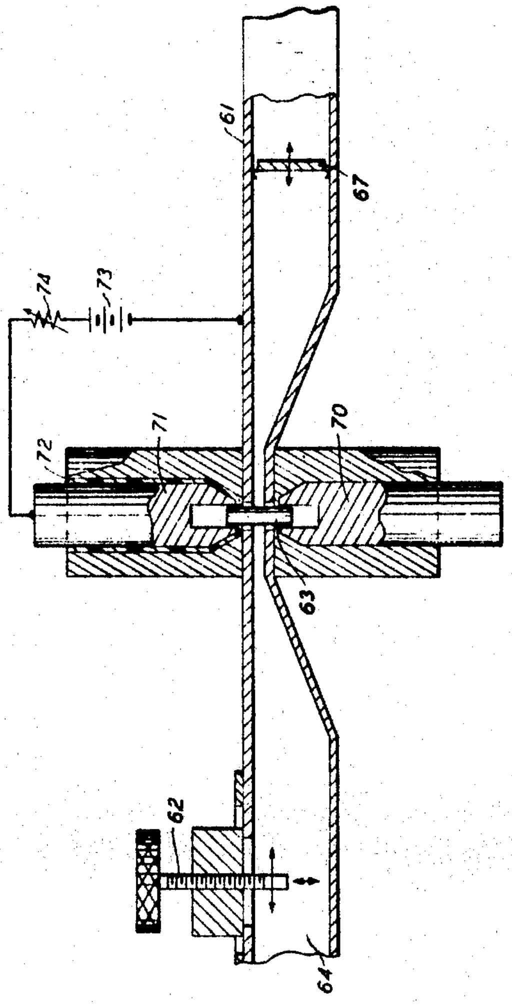
FIG. 6 is similar to FIG. 4, showing a structure in accordance with this invention exhibiting the parametric effect.

Although the foregoing description is in terms of an oscillator suitable as a primary source of high frequency energy the device also exhibits a parametric effect useful for parametric amplification and conversion in an appropriate structure. The structure of FIG. 6 again is a reduced height waveguide similar to dimensions to that described in connection with FIG. 4. However, the closed end 61 of the cavity is of full height which enables positioning of a tuning piston 67 at a greater distance from the diode 63. Additionally, a slide screw tuning element 62 is placed in the output portion 64 of the waveguide at a distance of several wavelengths from the diode 63. In a specific embodiment, using a 900 x 400 mil waveguide with a reduced height portion of 50 mils the distance from the diode 63 to the end of each tapered section was four and one-half inches. The tuning piston 67 had an adjustment range of from 5.75 inches to 7.25 inches from the diode and the slide screw tuner 62 an adjustment from 7.5 inches to 8.5 inches from the diode. The diode 63 is mounted in sockets 70 and 71 as shown, the upper socket 71 being insulated by a dielectric layer 72 of Mylar. A D.C. source 73 and variable resistor 74 are shown connected across the diode terminals. For a particular tuning of this apparatus, and using a semiconductor diode of the type described above, biased beyond avalanche breakdown at a value of 50 volts D.C. a simple three frequency parametric effect was observed. Specifically, output observed from the open end of the waveguide was detected at frequencies $f_1$, $f_2$ and $f_p$ where, in accordance with known principles $f_1+f_2=f_p$. In a particular instance $f_p=17.49$ gigacycles, $f_1=8.982$ gigacycles and $f_2=8.512$ gigacycles. These frequencies always maintained the additive relationship stated above as the tuning elements were varied until, at a critical tuning, oscillation at $f_1$ and $f_2$ disappeared leaving amplification bands. In other instances, $f_1$ and $f_2$ merge to yield an amplified signal at one-half the basic frequency, the degenerate parametric case. Thus, it appears that there results a parametric device in which the pumping energy at frequency $f_p$ is provided by transit time oscillations of the kind described hereinabove necessitating only the application of a D.C. bias whereupon this oscillation in turn pumps the nonlinear reactance of the diode giving rise to parametric oscillation or amplification depending on the circuit configuration.

It will be apparent to those skilled in the art that other parametric effects may be realized using the structures in accordance with this invention, simply by providing appropriate resonances and abstracting power at appropriate frequencies in accordance with known parametric device principles. Descriptions of these principles are set forth in, "Some General Properties of Nonlinear Elements. Part I. General Energy Relations," by J. M. Manley and H. E. Rowe, published in Proceedings of the IRE, volume 44, July 1956, pp. 904–913 and "Some General Properties of Nonlinear Elements. Part II. Small Signal Theory," by H. E. Rowe, published in Proceedings of the IRE, volume 46, May 1958, pp. 850–860. Thus to summarize, the following types of operation have been observed. First, the device has been operated as a three frequency inverter-type (negative resistance) in which gain or oscillations are obtained at two frequences $f_1$ and $f_2$, such that $f_1+f_2=f_p$ and both $f_1$ and $f_2$ are less than $f_p$. The device is capable also of operation as a three frequency noninverting (positive resistance) device in which up-conversion gain is obtained from $f_1$ to $f_2$ where $f_1+f_p=f_2$ and $f_2$ is greater than $f_p$, which, in turn, is greater than $f_1$. As noted above, the degenerate inverter-type operation in which $f_1$ and $f_2$ merge at one-half of $f_p$ also has been observed. In addition, harmonic generator types of operation have been achieved in which gain has been observed at harmonics of the frequency $f_p$.

Although the invention has been described in terms of certain specific embodiments, it will be understood that other arrangements may be devised by those skilled in the art which likewise are within the scope and spirit of the invention.

In particular, although the specific embodiment is in terms of silicon semiconductor material, other elemental and compound semiconductors may be used. Similarly, complementary P+PN+ structures can be used with appropriate reversal in polarity of the applied voltages. Moreover, although the cavity for mounting the diode in accordance with this invention is specifically described as a section of rectangular waveguide, other suitable resonant structures including coaxial lines of proper frequency capability may be used.

What is claimed is:

1. In a high frequency generator a semiconductor diode comprising a semiconductor body having a pair of terminal zones of relatively high conductivity and of opposite conductivity-type and an intermediate zone of relatively moderate conductivity, in which the intermediate zone and the terminal zone opposite in conductivity-type to said intermediate zone define therebetween a P-N junction and both are included within an epitaxially grown layer on the other terminal zone, and the intermediate zone and said other terminal zone define therebetween a junction between two zones of like conductivity type but different conductivities, a cavity housing the diode resonant at a frequency related to the transmit time of electrons across the intermediate zone of the diode, and means for applying a voltage to the diode for biasing the P-N junction beyond avalanche breakdown for the generation of electrons in the intermediate zone and the establishing of oscillations in the cavity at a resonant frequency.

2. In a high frequency generator a semiconductor diode of P+NN+ configuration in which the P+ and N zones define a PN junction and are included within an epitaxially deposited layer on the N+ substrate, and the N and N+ zones define an NN+ junction, a cavity housing the diode resonant at a frequency related to the transit time of electrons across the intermediate zone of the diode, and means for applying a steady voltage to the diode for biasing the P-N junction beyond avalanche breakdown for the generation of electrons at the P+ edge of the N zone for flow to the N+ zone and the establishing of oscillations in the cavity at said resonant frequency.

3. The high frequency generator in accordance with claim 2 wherein the semiconductor diode P+ and N+ zones have an impurity concentration level of about $10^{20}$ atoms per cc. and the N zone has an impurity concentration of about $10^{16}$ atoms per cc.

4. The high frequency generator in accordance with claim 2 wherein the N zone of the semiconductor diode has a thickness of less than about 15 microns.

5. The high frequency generator in accordance with claim 2 wherein the semiconductor diode is fabricated from silicon semiconductor material.

6. The high frequency generator in accordance with claim 1 wherein the cavity housing the diode is resonant at a first frequency $f_p$ related to the transmit time of electrons across the intermediate zone of the diode and at other frequencies parametrically related to said first frequency.

7. The high frequency generator in accordance with claim 1 wherein the cavity housing the diode is resonant at a first frequency $f_p$ related to the transit time of electrons across the intermediate zone of the diode and at two other frequencies $f_1$ and $f_2$, whose sum is substantially equal to said first frequency, and $f_1$ and $f_2$ are less than $f_p$.

8. The high frequency generator in accordance with claim 1 wherein the cavity housing the diode is resonant at a first frequency $f_p$ related to the transit time of electrons across the intermediate zone of the diode and at another frequency substantially equal to one-half said first frequency.

9. The high frequency generator in accordance with claim 1 wherein the cavity housing the diode is resonant at a first frequency $f_p$ related to the transit time of electrons across the intermediate zone of the diode and at other frequencies substantially equal to $x$ times said first frequency $f_p$ wherein $x$ is an integer.

10. The high frequency generator in accordance with claim 1 wherein the cavity housing the diode is resonant at a first frequency $f_p$ related to the transit time of electrons across the intermediate zone of the diode and at two other frequencies $f_1$ and $f_2$ such that $f_1+f_p$ are substantially equal to $f_2$ and $f_2>f_p>f_1$.

References Cited by the Applicant

UNITED STATES PATENTS 2,899,652 8/1959 Read.

2,908,871 10/1959 McKay.

ROY LAKE, *Primary Examiner.*

J. KOMINSKI, *Assistant Examiner.*